United States Patent [19]

Krieger et al.

[11] 3,770,874

[45] Nov. 6, 1973

[54] CONTACT MEMBERS FOR SOLDERING ELECTRICAL COMPONENTS

[75] Inventors: Friedrich Krieger, Gilching; Oskar Wirbser, Unterpfaffenhofen; Albert Pfeiffer, Munich, all of Germany

[73] Assignee: Siemens Aktiengesellschaft, Berlin and Munich, Germany

[22] Filed: Sept. 7, 1971

[21] Appl. No.: 178,168

[30] Foreign Application Priority Data

Sept. 8, 1970 Germany .................. P 20 44 494.4

[52] U.S. Cl. ....... 174/68.5, 317/101 CC, 339/275 B, 339/275 C, 339/275 T

[51] Int. Cl. ............................................ H05k 1/00

[58] Field of Search .................... 317/234 L, 234 M, 317/234 N; 339/275 B, 275 C, 275 F, 278 C; 174/68.5

[56] References Cited

UNITED STATES PATENTS

| | | | |
|---|---|---|---|
| 3,059,152 | 10/1962 | Khouri | 339/275 X |
| 3,303,393 | 2/1967 | Hymes et al. | 174/68.5 X |
| 3,300,340 | 1/1967 | Calandrello et al. | 317/234 UX |
| 3,517,279 | 6/1970 | Ikeda et al. | 317/234 UX |

FOREIGN PATENTS OR APPLICATIONS

| | | | |
|---|---|---|---|
| 1,185,662 | 1/1965 | Germany | 339/275 B |

OTHER PUBLICATIONS

IBM Technical Disclosure Bulletin, "Electrode Pattern" by J. C. Milliken and J. Parslow, Vol. 11, No. 7, December 1968, p. 850.

*Primary Examiner*—J. Spencer Overholser
*Assistant Examiner*—Ronald J. Shore
*Attorney*—Carlton Hill et al.

[57] ABSTRACT

Contact members for soldering components to a circuit means or wiring boards, wherein the components include semiconductors, integrated or hybrid circuits such as flip-chip circuit for assembly by reflow-solder methods. A contact member comprises at least two equal geometric areas interconnected by a narrow bridge. In preferred embodiments the contact members are composed of a base gold layer overcoated with a nickel layer.

5 Claims, 2 Drawing Figures

INVENTORS
Friedrich Krieger
Oskar Wirbser
Albert Pfeiffer

BY Hill, Sherman, Meroni, Gross & Simpson ATTYS

CONTACT MEMBERS FOR SOLDERING ELECTRICAL COMPONENTS

BACKGROUND OF THE INVENTION

1. Field of the Invention

The invention relates to contact members for soldering components to circuit means or wiring boards, such as flip-chip circuits for assembly by reflow-solder methods.

2. Prior Art

When flip-chip members are soldered onto substrates by reflow-solder methods, an evenly shaped solder dome or hemisphere is required at the area of connection. Known contact members are of a rectangular configuration. Solidified solder surfaces produced during the tinning process in the swell or dip bath result in a curved configuration because of the surface tension of the liquid solder at the edges of the contact member. As a result, the solder layer is of a varying thickness on the contact member. Accordingly, in some instances no connection between such members and other components are possible, while in other instances expressive solder causes short circuits.

When components, such as semiconductors are removed, as during repair procedures, an amount of solder is also removed. The amount of solder remaining on the contact member thus becomes less and less and can be missing when new components are associated with the contact members. The subsequent addition of an amount of liquefied solder is almost impossible and requires excessive expenditures in time and money, primarily due to the extreme smallness of the contact members and due to the concentration of such members next to one another on a substrate.

Gold is generally utilized for the contact members since it has a good conductivity for electric current, is generally inert to chemicals utilized in electrical assemblies and is readily moistened by solder materials. However, the use of gold also includes drawbacks, for example it is readily soluble in tin-containing solder materials, causing the solder to become brittle and raising the melting point thereof.

Accordingly, the invention provides contact members for soldering electrical components to circuits or the like, such as flip-chip circuits for assembly by reflow-solder methods, which avoid prior art drawbacks.

SUMMARY OF THE INVENTION

The invention provides a contact member for electrical components comprised of two or more geometric areas interconnected with each other by a narrow bridge so that solder hemisphere-like areas form on each geometric area and one or more such solder hemispheres functions as the connection point with the electrical components while the remaining solder areas function as a solder reserve and as a measuring means or reference of the amount of solder on the contact member.

In a preferred embodiment, the contact member is composed of a base layer of gold overcoated with a layer of nickel for direct contact with the solder.

BRIEF DESCRIPTION OF THE DRAWINGS

An understanding of further particulars of the invention may be obtained from the consideration of the following detailed description of respective embodiments thereof in conjunction with the accompanying figures in the drawings, in which.

DESCRIPTION OF THE PREFERRED EMBODIMENTS

Figure 1:
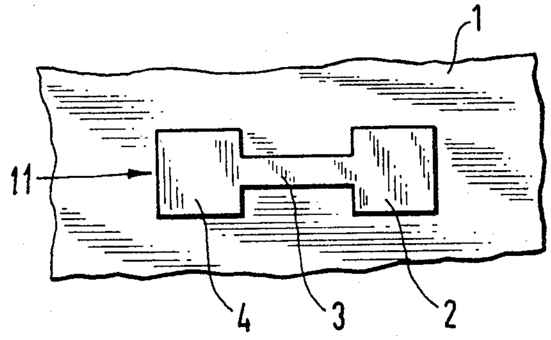
FIG. 1 is essentially a partial enlarged top plan view of an embodiment of contact members in accordance with the principles of the invention.

The invention provides, in its article embodiments, contact members for soldering electrical components, such as semiconductors, integrated or hybrid circuits, etc., for assembly as by reflow-solder methods that allow improved solder distribution on the contact member and provide a solder reservoir for subsequent soldering operations. The contact members of the invention comprise a plurality of generally equal geometric areas interconnected to one another by a narrow bridge area. The contact members are composed of a relatively inert, electrically conductive metal, such as gold, silver, platinum, etc.

In certain embodiments, the contact members are composed of a base layer of a relatively inert electrically conductive metal and a superimposed layer of another metal which is not disposed to interaction with solder materials and functions as a barrier between the underlying metal and the solder. Preferably, the base or underlying layer is composed of gold and the barrier or overlying layer is composed of nickel.

Embodiments utilizing a barrier layer as the outer surface of a contact member include further advantages. For example, tin-gold compounds are not formed and the melting point of the solder remains constant, at least at the connection point. Solder materials thus protected melt at the same temperature even if they are reheated several times, as during repair.

Division of the contact member into a plurality of surfaces or areas that are interconnected by narrow bridges provide an effective control of heat applied to each such area. Heat tends to be transferred on surfaces in direct relation to the amount of surface area available Accordingly, the narrow bridge areas regulate the amount of heat passing from one contact member to the other. Additionally, the concentration of solder on a surface is related to the area of the surface. Thus, solder forms relatively thick layers on the relatively larger geometric areas of the contact member and forms relatively thin layers on the bridge areas, further regulating heat transfer between such areas. Therefore the invention broadly provides a means for distributing solder on contact members that regulate the solder concentration on select areas of the contact member and regulate heat transfer between solder on such areas.

In the embodiments illustrated, similar reference numerals designate similar elements.

FIG. 1 partially illustrates a contact member 11 of the invention on a non-conductive substrate 1, such as composed of a synthetic resin material, for example, "Bakelite" (a registered trademark for a phenolicformaldehyde resin). Other non-conductive substrates are also useful, for example of glass, of ceramics, etc.

The contact member 11 is comprised of at least two substantially equal geometric surfaces or areas 2 and 4 respectively and a smaller narrow bridge area 3. The areas 2 and 4 are interconnected with each other by the narrow bridge area 3. In the embodiment illustrated, the areas 2 and 4 are of square-like or rectangular configuration but other geometric configurations, such as circular or elliptical are also useful. The contact member (including areas 2, 3 and 4) is composed of a relatively inert, electrically conductive metal, which in preferred embodiments is gold.

The contact member 11 is bonded to the substrate 1, as by an adhesive layer (not shown), by a metal-resin bond, or some other suitable means.

Figure 2:
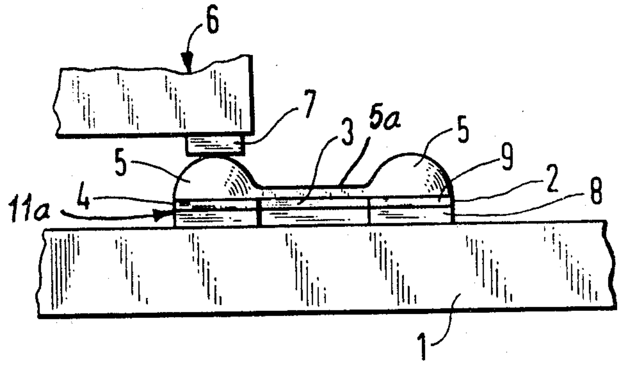
FIG. 2 is essentially a partial side plan view illustrating an embodiment of contact members of the invention in partial assembly with an associate electrical component.

In FIG. 2, a contact member 11*a* is illustrated as bonded to a non-conductive substrate 1. The contact member 11*a* comprises at least two geometric areas 2 and 4 interconnected by a narrow bridge area 3. The areas 2, 3 and 4 are composed of a base layer 8, as of gold and a superimposed layer 9, as of nickel. After application of a liquid solder, as by dipping, substantially identical, relatively thick solder domes or hemisphere areas 5 form on each of the areas 2 and 4 and a relatively thin solder layer 5*a* forms on bridge area 3.

An electrical component 6, such as a semiconductor, integrated or hybrid circuits, such as flip-chip circuits for assembly by reflow-solder methods, etc., having a contact area 7 is positioned in working relation with, for example, area 4 of contact member 11*a*. Localized heat is applied to one of the solder domes 5 so that a bond forms between the contact area 7 and the solder. Even if excessive heat is provided so that all of the solder is melted, no damage occurs since the solder is distributed over a plurality of areas on the contact member, and all areas receive a substantial equal amount thereof in accordance with their respective surface areas and solder is not missing or superfluous in any one of the areas. Further, the solder areas open for view (i.e., not connected to a semiconductor component) allows one to readily determine the amount of solder available on a given contact member. The non-connected solder areas function as a reservoir of solder for the connected solder areas in subsequent soldering operations.

The barrier layer 9 of nickel prevents diffusion or the like from occurring between the solder and the gold in base layer 8. Accordingly, the solder remains relatively pure and maintains its original melting point throughout various operations.

In its method embodiments the invention provides a method of soldering an electrical component to electrical circuit means, such as integrated or hybrid circuits and/or wiring boards such as flip-chip circuits for assembly by a reflow-solder process. Generally, the invention comprises dividing an electrically conductive contact member into at least two surfaces or areas that are interconnected by a relatively narrow bridge surface or area, distributing solder onto the surfaces of the contact member and contacting an electrical component with the solder on one of the contact member surfaces so as to define a connection point between the component and the contact member. The solder on another surface of the contact member serves as a solder reservoir for the connection point.

In certain method embodiments, an electrically conductive solder barrier layer is coated onto the contact member base material to prevent interaction between the solder and the base material.

It will be understood that modifications and variations can be effected without departing from the novel concepts of the present invention.

We claim:

1. A contact member for reflow soldering of an electrical component to a circuit means comprising;

at least two conductive substantially equal geometric areas spaced apart from one another on a nonconductive substrate and supported thereby;

a conductive bridge of a width smaller than one of said geometric areas and sufficiently wide for solder flow from one geometric area to another, said bridge being positioned on said non-conductive substrate to connect said geometric areas with one another; and substantially equal layers of solder of a given thickness on each of said geometric areas and a layer of solder on said bridge of a thickness less than said given thickness.

2. A contact member as defined in claim 1 wherein the geometric areas and the bridge area are composed of a metal having good electrical conductivity.

3. A contact member as defined in claim 1 wherein the geometric areas and the bridge area are comprised of a base layer of a relatively inert, electrically conductive metal and a superimposed layer of another electrically conductive metal characterized by resistance to interaction with tin-containing solder materials.

4. A contact member as defined in claim 3 wherein the base layer is of gold and the superimposed layer is of nickel.

5. A contact member for reflow soldering of an electrical component as to flip-chip circuits, hybrid circuits or wiring boards comprising at least two conductive substantially equal square-like areas spaced apart from one another on a nonconductive substrate and supported thereby, said areas being composed of a base layer of gold in direct contact with non-conductive substrate and a superimposed layer of nickel in direct contact with said base layer;

a layer of solder of a given thickness on each of said square-like areas;

a conductive bridge of a width smaller than one of said square-like areas and sufficiently wide for solder flow from one of said square-like areas to another, said bridge being positioned on said nonconductive substrate to connect said square-like areas with one another, said bridge being composed of a base layer of gold in direct contact with said non-conductive substrate and a superimposed layer of nickel in direct contact with said base layer; and a layer of solder of a thickness less than said given thickness on said bridge.

* * * * *